US010804109B2

United States Patent
Yang et al.

(10) Patent No.: US 10,804,109 B2
(45) Date of Patent: Oct. 13, 2020

(54) SURFACE TREATMENT OF SILICON AND CARBON CONTAINING FILMS BY REMOTE PLASMA WITH ORGANIC PRECURSORS

(71) Applicants: Mattson Technology, Inc., Fremont, CA (US); Beijing E-Town Semiconductor Technology, Co., LTD, Beijing (CN)

(72) Inventors: Michael X. Yang, Palo Alto, CA (US); Hua Chung, Saratoga, CA (US); Xinliang Lu, Fremont, CA (US)

(73) Assignees: MATTSON TECHNOLOGY, INC., Fremont, CA (US); BEIJING E-TOWN SEMICONDUCTOR TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/958,635

(22) Filed: Apr. 20, 2018

(65) Prior Publication Data

US 2019/0103270 A1  Apr. 4, 2019

Related U.S. Application Data

(60) Provisional application No. 62/567,295, filed on Oct. 3, 2017.

(51) Int. Cl.
*H01L 21/30* (2006.01)
*C23C 16/452* (2006.01)
(Continued)

(52) U.S. Cl.
CPC ........ *H01L 21/3003* (2013.01); *B01D 67/009* (2013.01); *C23C 16/452* (2013.01);
(Continued)

(58) Field of Classification Search
CPC combination set(s) only.
See application file for complete search history.

(56) References Cited

U.S. PATENT DOCUMENTS 4,885,067 A * 12/1989 Doty ................... C23C 16/4488
                                                             204/157.6
5,275,798 A *  1/1994 Aida .................... C23C 16/272
                                                             117/103
(Continued)

FOREIGN PATENT DOCUMENTS

KR         10-0777043        11/2007
KR      10-2013-0056595       5/2013
(Continued)

OTHER PUBLICATIONS

Michael X. Yang et al., U.S. Appl. No. 15/958,560, filed Apr. 20, 2018, Surface Treatment of Silicon or Silicon Germanium Surfaces Using Organic Radicals.
(Continued)

*Primary Examiner* — Moin M Rahman
(74) *Attorney, Agent, or Firm* — Dority & Manning, P.A.

(57) ABSTRACT

Surface treatment processes for treating low-k dielectric materials are provided. One example implementation can include a method for processing a workpiece. The workpiece can include a silicon and carbon containing film material. The method can include treating the workpiece with a surface treatment process. The surface treatment process can include generating one or more species in a first chamber; mixing one or more hydrocarbon molecules with the species to create a mixture comprising one or more organic radicals; and exposing the silicon and carbon containing layer on the workpiece to the mixture in a second chamber.

27 Claims, 9 Drawing Sheets

(51) Int. Cl.

| | | |
|---|---|---|
| *H01L 21/302* | (2006.01) | |
| *H01L 21/311* | (2006.01) | |
| *H01L 21/3213* | (2006.01) | |
| *B01D 67/00* | (2006.01) | |
| *C23F 1/12* | (2006.01) | |
| *H01L 21/306* | (2006.01) | |
| *H01L 21/3105* | (2006.01) | |
| *H01L 21/321* | (2006.01) | |
| *H01L 21/02* | (2006.01) | |
| *H01J 37/32* | (2006.01) | |
| *H01L 21/027* | (2006.01) | |
| *H01L 21/768* | (2006.01) | |
| *C23F 4/00* | (2006.01) | |

(52) U.S. Cl.
CPC .......... *C23F 1/12* (2013.01); *H01J 37/32743* (2013.01); *H01J 37/32899* (2013.01); *H01L 21/0234* (2013.01); *H01L 21/0271* (2013.01); *H01L 21/02118* (2013.01); *H01L 21/02252* (2013.01); *H01L 21/02321* (2013.01); *H01L 21/302* (2013.01); *H01L 21/306* (2013.01); *H01L 21/3105* (2013.01); *H01L 21/31058* (2013.01); *H01L 21/31138* (2013.01); *H01L 21/321* (2013.01); *H01L 21/32136* (2013.01); *H01L 21/76826* (2013.01); *C23F 4/00* (2013.01); *H01J 37/321* (2013.01); *H01J 2237/006* (2013.01); *H01J 2237/332* (2013.01)

(56) References Cited

U.S. PATENT DOCUMENTS

| | | | |
|---|---|---|---|
| 5,811,022 | A | 9/1998 | Savas et al. |
| 6,028,015 | A | 2/2000 | Wang |
| 6,107,197 | A | 8/2000 | Suzuki |
| 6,677,251 | B1 | 1/2004 | Lu |
| 7,541,200 | B1 | 6/2009 | Schravendijk et al. |
| 7,604,708 | B2 | 10/2009 | Wood et al. |
| 7,807,579 | B2 | 10/2010 | Yang |
| 7,901,743 | B2 | 3/2011 | Lee et al. |
| 8,821,987 | B2 | 9/2014 | Shanker |
| 9,214,319 | B2 | 12/2015 | Nagorny et al. |
| 9,837,270 | B1 | 12/2017 | Varadarajan et al. |
| 2003/0042465 | A1 | 3/2003 | Ko |
| 2003/0134051 | A1 | 7/2003 | Jung et al. |
| 2004/0154743 | A1 | 8/2004 | Savas |
| 2006/0081273 | A1 | 4/2006 | McDermott |
| 2007/0072422 | A1 | 3/2007 | Yeh |
| 2007/0190266 | A1 | 8/2007 | Fu |
| 2008/0261405 | A1 | 10/2008 | Yang |
| 2009/0050271 | A1* | 2/2009 | Goyal ................ H01L 21/0338 156/345.25 |
| 2009/0274610 | A1 | 11/2009 | Ghoanneviss et al. |
| 2011/0117751 | A1 | 5/2011 | Sonthalia |
| 2012/0285481 | A1 | 11/2012 | Lee et al. |
| 2013/0023124 | A1* | 1/2013 | Nemani ............ H01L 21/31116 438/703 |
| 2013/0034968 | A1 | 2/2013 | Zhang |
| 2014/0113532 | A1* | 4/2014 | Smith .................. B24B 53/017 451/443 |
| 2014/0261186 | A1* | 9/2014 | Cho ..................... C23C 16/4585 118/729 |
| 2015/0108493 | A1* | 4/2015 | Kang ................ H01L 21/02447 257/76 |
| 2015/0126027 | A1 | 5/2015 | Matsumoto |
| 2015/0239759 | A1* | 8/2015 | Kang ........................ C02F 1/72 210/748.17 |
| 2015/0303065 | A1 | 10/2015 | Buckalew |
| 2016/0020089 | A1* | 1/2016 | Thadani ............ H01L 21/02126 438/786 |
| 2016/0079062 | A1 | 3/2016 | Zheng et al. |
| 2016/0260616 | A1 | 9/2016 | Li |
| 2016/0276134 | A1* | 9/2016 | Collins ............... H01J 37/3255 |
| 2017/0029950 | A1* | 2/2017 | Chen ...................... C23C 16/26 |

FOREIGN PATENT DOCUMENTS

| | | |
|---|---|---|
| WO | WO 2010-045153 | 4/2010 |
| WO | WO 2017/147365 | 8/2017 |

OTHER PUBLICATIONS

Michael X. Yang et al., U.S. Appl. No. 15/958,601, filed Apr. 20, 2018, Surface Treatment of Carbon Containing Films Using Organic Radicals.

PCT International Search Report and Written Opinion for corresponding PCT Application No. PCT/US2018/051714, dated Jan. 11, 2019—13 pages.

J. Bao et al., Mechanistic Study of Plasma Damage and $CH_4$ Recovery of Low k Dielectric Surface, International Interconnect Technology Conference, IEEE 2007, 147-149.

HMDS (available online) Retrieved from the internet May 17, 2018, https://www.microchemicals.com/products/adhesion_promotion/hmds.html—2 pages.

PCT International Preliminary Report on Patentability for corresponding PCT Application No. PCT/US2018/051714, dated Apr. 8, 2020, 10 pages.

* cited by examiner

SURFACE TREATMENT OF SILICON AND CARBON CONTAINING FILMS BY REMOTE PLASMA WITH ORGANIC PRECURSORS

PRIORITY CLAIM

The present application claims the benefit of priority of U.S. Provisional Application Ser. No. 62/567,295, titled "Surface Treatment of Silicon and Carbon Containing Films by Remote Plasma with Organic Precursors," filed Oct. 3, 2017, which is incorporated herein by reference for all purposes.

FIELD

The present disclosure relates generally to surface treatment of a substrate, such as a semiconductor workpiece.

BACKGROUND

Carbon-containing low-dielectric constant (k) dielectric materials are being increasingly used in semiconductor device fabrication. For instance, SiOCN can be used as a spacer material in front-end-of-line (FEOL) applications in advanced semiconductor devices. SiOC can be used as interconnect dielectric in back-end-of-line (BEOL) applications.

Carbon-containing low-k dielectric materials, such as porous low-k dielectric materials, can be susceptible to damage by semiconductor fabrication process steps (e.g., oxygen containing plasma dry etch, containing plasma dry ash, wet clean, chemical mechanical polish (CMP), etc.). Such damage can include, for instance, increase in dielectric constant (k) associated with the depletion of carbon film exposed surface area (e.g., top surface, side wall, etc.) and replacement of Si—$CH_3$ (methyl) bonds with Si—OH (hydroxyl) bonds.

SUMMARY

Aspects and advantages of embodiments of the present disclosure will be set forth in part in the following description, or may be learned from the description, or may be learned through practice of the embodiments.

One example aspect of the present disclosure is directed to a method for processing a workpiece. The workpiece can include a silicon and carbon containing film material. The method can include performing an organic radical based surface treatment process on the silicon and carbon containing film material. The surface treatment process can include generating one or more species in a first chamber; mixing one or more hydrocarbon molecules with the species to create a mixture comprising one or more organic radicals; and exposing the silicon and carbon containing layer on the workpiece to the mixture in a second chamber.

Other example aspects of the present disclosure are directed to systems, methods, and apparatus for surface treatment of workpieces.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
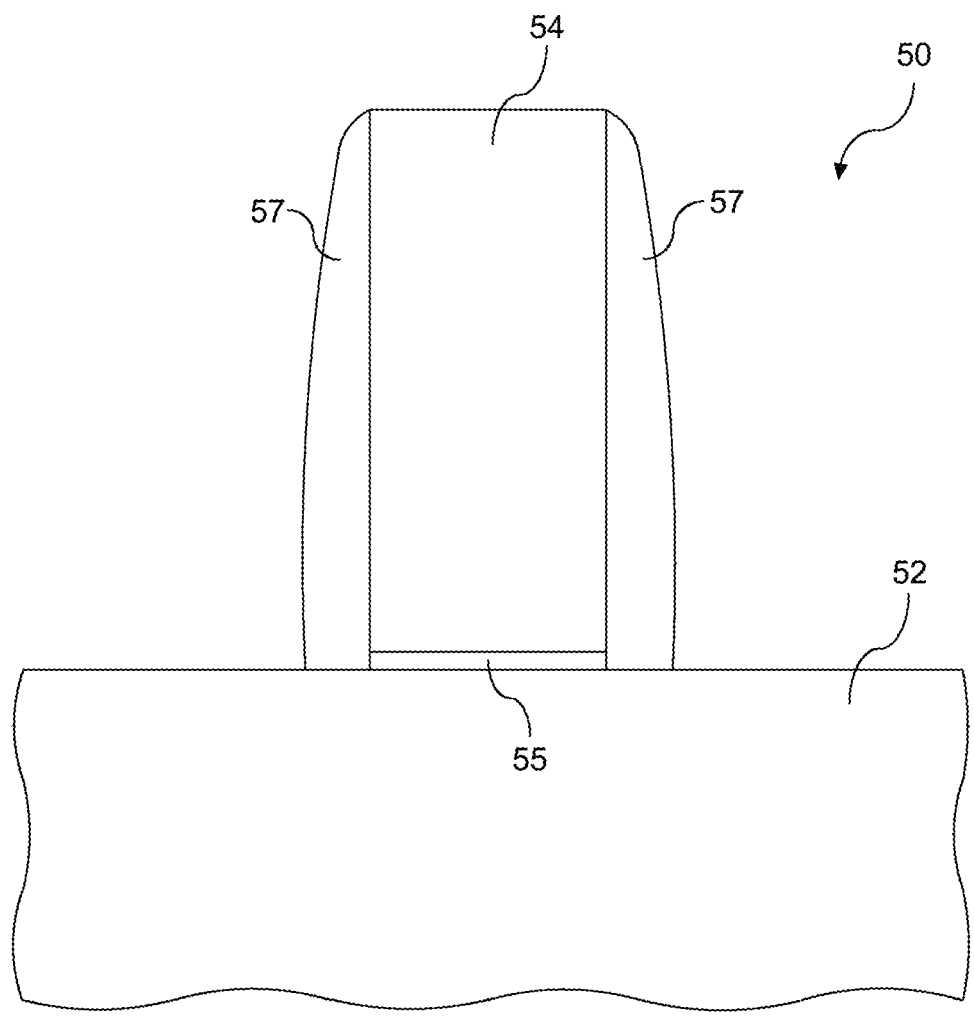
FIG. 1 depicts an example front-end-of-line (FEOL) spacer structure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to surface treatment processes for treating silicon and carbon-containing low-k dielectric film materials on a workpiece, such as a semiconductor wafer. Low dielectric constant (e.g., "low-k") dielectric materials can be used in the fabrication of advanced semiconductor devices. A low-k dielectric material can have a dielectric constant of less than about 3.0, such as less than about 2.5, such as less than about 2.2. As used herein, the use of the term "about" in conjunction with a numerical value can refer to within 20% of the stated numerical value.

Low-k dielectric materials can be used, for instance, in front-end-of-line (FEOL) applications as spacers between gates and sources and/or gates and drains. FIG. 1 depicts a workpiece 50 with an example low-k spacer structure. More particularly, the workpiece 50 includes a semiconductor substrate 52 (e.g., silicon) with a transistor structure 54 (e.g., a gate). A dielectric layer 55 can be disposed between the transistor structure 54 and the semiconductor substrate 52. A spacer structure (e.g., a gate sidewall spacer structure) can at least partially surround the transistor structure 54. The spacer structure can include a silicon and carbon-containing thin film 57. In some embodiments, the film 57 can additionally include nitrogen. In some embodiments, the film 57 can additionally include oxygen. In some embodiments, the film 57 can be a silicon carbonitride (SiCN) film. In some embodiments, the film 57 can be a silicon oxycarbonitride (SiOCN) film. Semiconductor fabrication processes, such as oxygen containing plasma dry etch, plasma dry ash, wet clean, etc., can cause damage to (e.g., increase the k-value) of the film 57 used as part of the spacer structure in FEOL applications.

Figure 2:
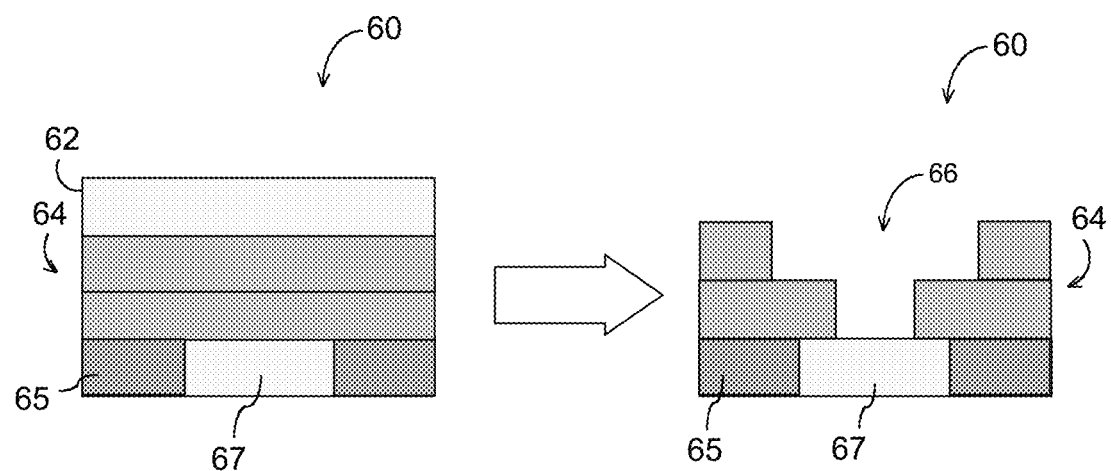
FIG. 2 depicts an example back-end-of-line (BEOL) interconnect structure.

Low-k dielectrics can also be used in back-end-of-line (BEOL) applications, such as part of an interconnect structure (e.g., a Cu interconnect structure). For instance, FIG. 2 depicts an example process flow for fabricating a copper interconnect structure in BEOL. As shown, a workpiece 60 includes a resist layer 62 and a silicon and carbon-containing low-k dielectric film layer 64 formed over a layer 65 with a copper portion 67. In some embodiments, the low-k dielectric film layer 64 can additionally include oxygen. In some embodiments, the low-k dielectric film layer 64 can be a silicon oxycarbide (SiOC) layer. In some embodiments, the low-k dielectric film layer 64 can be porous. For instance, the low-k dielectric film layer can have a porosity in the range of about 1% to about 50%. As used herein, "porosity" can be a measure the volume of voids or empty spaces in a material relative to the total volume of the material.

The workpiece 60 can be subjected to a plasma etch process to generate a trench 66 and/or via structure in the low-k dielectric film layer 64. The plasma etch process can be an oxygen containing dry etch process. The plasma etch process can be followed by deposition of ultra-thin Cu layers prior to Cu seed deposition and bulk plating (not shown). The plasma etch process can cause damage to and/or increase the dielectric constant of the low-k dielectric film layer 64. For instance, the low-k dielectric film layer 64 can be damaged by depletion of methyl ($CH_3$ groups) in exposed surface area (e.g., onside wall, etc.) and replacement of Si—C (carbon) bonds (e.g. Si—$CH_3$ bonds) with Si—O (oxygen) bonds (e.g. Si—OH bonds). The damage can result in an increase of the dielectric constant of the low-k dielectric film 64.

Surface treatment processes can be performed to restore the low-k dielectric materials (e.g., layer 57 in the spacer structure 55, low-k dielectric film layer 64 used as part of an interconnect structure 60, etc.). In addition, surface treatment processes can be performed (e.g., in BEOL interconnect structure fabrication) to seal pores of the low-k dielectric material prior to Cu deposition in BEOL interconnect applications.

Example surface treatment processes that can be performed after BEOL plasma etch on low-k dielectric materials: ultraviolet (UV) assisted thermal curing; hydrocarbon plasma treatment; and gas only or plasma based silylation processes. UV thermal curing can remove hydroxyl groups formed during plasma etch of a low-k dielectric material. However, this thermal curing can be, in example instances, effective only at high temperatures (e.g., 600° C. to 1000° C.), which is not suitable for BEOL applications. Hydrocarbon plasma treatment using methane ($CH_4$) or other hydrocarbons can build a carbon rich layer on the low-k dielectric material, but with no significant restoration of the low-k dielectric material. In addition, the plasma treatment may expose workpiece devices to potential plasma damage. Silicon and hydrocarbon containing silylation precursors can react with Si—OH bonds at low temperatures (e.g., less than 300° C.) and can accomplish k-value restoration of damaged low-k dielectric materials. However, silylation precursors can react with exposed underlying Cu surface 67 in a BEOL interconnect structure 60 and adversely impact Cu line resistance. As a result, the use of silylation processes may not be a viable option for BEOL applications.

According to example aspects of the present disclosure, a post-etch surface treatment process performed on low-k dielectric materials can incorporate desired organic radical precursors (e.g., $CH_3$ radicals). The organic radical based surface treatment process can result in attachment of organic radicals (e.g., methylation based on $CH_3$ radicals in a gas phase) on at least a portion of the low-k dielectric material. Desired organic radical precursors (e.g., $CH_3$ radicals) can replace Si—OH bonds with Si—C (e.g., Si—$CH_3$) bonds at low temperatures (e.g., less than 300° C.) for restoration (e.g., k-value restoration) of damaged low-k dielectric materials.

The desired organic radical precursors (e.g., $CH_3$ radicals) can restore low-k dielectric materials without negatively affecting, for instance, underlying Cu surfaces. Desired organic radical precursors (e.g., $CH_3$ radicals) can also reduce the deposition of a carbon layer on the low-k dielectric material.

The organic radical based surface treatment process can include filtering ions while allowing the passage of neutral radicals for exposure to the workpiece. For instance, a separation grid can be used to filter ions generated in a plasma chamber and allow passage of neutral radicals through holes in the separation grid to a processing chamber for exposure to the workpiece.

In some embodiments, the organic radicals can be generated by disassociating one or more hydrocarbon molecules in a plasma chamber. For instance, a plasma can be generated (e.g., using an inductive plasma source, capacitive plasma source, or other plasma source) with hydrocarbon precursors in a plasma chamber to treat a workpiece having a silicon and carbon containing film in a processing chamber. The plasma chamber can be remote from the processing chamber. A separation grid assembly can separate the plasma chamber from the processing chamber. The separation grid assembly can perform ion filtering to reduce direct plasma damage on the workpiece. In addition, radical selection (e.g., $CH_3$ radicals) can be accomplished with reduced plasma energy (e.g., using pulsed power to energize an inductively coupled plasma source). Radical selection can also be accomplished with a scheme to inject additional gas after ion filtering.

In some embodiments, the hydrocarbon precursor can be selected to avoid elements that can negatively interact with, for instance, an underlying Cu surface in a BEOL application. For instance, the hydrocarbon precursor can avoid silicon and oxygen. The hydrocarbon precursors can be tailored for effective diffusion through damaged dielectric layers and/or can be configured for pore sealing of porous low-k dielectric materials.

Example hydrocarbon molecules can include, for instance, non-cyclic alkanes $C_nH_{2n+2}$ where n is greater than or equal to one and less than or equal to 10. For instance, the hydrocarbon molecules can include non-cyclic alkanes, such as methane $CH_4$, ethane $C_2H_6$, propane or iso-propane $C_3H_8$, etc.

In some embodiments, the hydrocarbon molecules can include cyclic alkanes where n is greater than or equal to five and less than or equal to ten. For instance, the hydrocarbon precursor can include cyclic alkanes such as cyclopentane $C_5H_{10}$, cyclohexane $C_6H_{12}$, methyl-cyclohexane, $C_7H_{14}$, dimethyl-cyclohexane $C_8H_{16}$, 1,3,5-trimethyl-cyclohexane $C_9H_{18}$, etc.

In some embodiments, the hydrocarbon precursors can include alkenes $C_nH_{2n}$, where n is greater than or equal to two and less than or equal to ten, such as ethylene $C_2H_4$, propene $C_3H_6$, etc.

In some embodiments, the hydrocarbon precursor can be combined with other reactive gases to replace undesirable Si—OH bonds in the damaged low-k dielectric material with Si—$CH_3$ bonds for k-value restoration. For example, the hydrocarbon precursor can be combined with a reactive gas, such as hydrogen $H_2$.

In some embodiments, the organic radical based surface treatment process can include generating one or more species in a plasma chamber that is separated from the processing chamber by a separation grid. The species can be generated, for instance, by inducting a plasma in a process gas. In some embodiments, the process gas can be an inert gas, such as helium, argon, xenon, etc. An inductive plasma generated using an inductive plasma source in the inert gas can generate one or more excited inert gas molecules (e.g., excited helium atoms). In some embodiments, the process gas can be a hydrogen gas. An inductive plasma generated using an inductive plasma source in the process gas can generate one or more hydrogen radicals.

In some embodiments, desired radicals (e.g., $CH_3$ radicals) can be generated by injecting a gas into post plasma mixtures. For instance, a plasma (e.g., $H_2$ plasma or inert gas plasma, such as He plasma) can be generated in a remote plasma chamber. The mixture can pass through a separation grid assembly for ion filtering. Post ion filtering, a hydrocarbon (e.g., $CH_4$) can be injected into the filtered mixture for generation of selected radicals (e.g., $CH_3$ radicals).

The organic radicals can be generated using other approaches. For instance, organic radicals can be generated using pyrolysis (thermal decomposition) of molecules (e.g., azomethane $CH_3$—N=N—$CH_3$) or UV-assisted molecule dissociation (e.g., acetone $CH_3COCH_3$).

In some embodiments, a plurality of surface treatment processes according to example embodiments of the present disclosure can be implemented. The plurality of surface treatment processes can be performed sequentially. Each surface treatment process can have different characteristics. For instance, smaller size hydrocarbon molecules can be used in a first surface treatment process for effective diffusion into a damaged low-k material for k-value restoration. Larger and/or cyclic hydrocarbon molecules can be used in a second surface treatment process for effective pore sealing of a porous low-k material. As another example, different amounts of power to energize an inductively coupled plasma source for generation of the plasma in a remote plasma chamber can be used for each of the plurality of surface treatment processes. As another example, different pressures can be used for each of the plurality of surface treatment processes.

Aspects of the present disclosure are discussed with reference to a "wafer" or semiconductor wafer for purposes of illustration and discussion. Those of ordinary skill in the art, using the disclosures provided herein, will understand that the example aspects of the present disclosure can be used in association with any semiconductor substrate or other suitable substrate. In addition, the use of the term "about" in conjunction with a numerical value is intended to refer to within ten percent (10%) of the stated numerical value. A "pedestal" refers to any structure that can be used to support a workpiece.

One example embodiment of the present disclosure is directed to a method for processing a workpiece. The workpiece includes a silicon and carbon containing film material. The method includes performing an organic radical based surface treatment process on the silicon and carbon containing film material. The surface treatment process can include generating one or more species in a first chamber; mixing one or more hydrocarbon molecules with the species to create a mixture comprising one or more organic radicals (e.g., a $CH_3$ radical); and exposing the silicon and carbon containing layer on the workpiece to the mixture in a second chamber. In some embodiments, the organic radical based surface treatment process can result in methylation on at least a portion of the silicon and carbon containing film material.

In some embodiments, the silicon and carbon containing film material comprises oxygen. In some embodiments, the film material has a porosity of about 1% to about 50%. In some embodiments, the silicon and carbon containing film material comprises nitrogen. In some embodiments, the silicon and carbon containing film material is used as at least a part of a spacer structure formed in a front-end-of-line application. In some embodiments, the silicon and carbon containing film material is used as at least a part of an interconnect structure formed in a back-end-of-line application.

In some embodiments, the one or more hydrocarbon molecules have a chemical formula of $C_nH_{2n+2}$, where n is greater than or equal to 1 and less than or equal to 10. In some embodiments, one or more hydrocarbon molecules have a chemical formula of $C_nH_{2n}$, where n is greater than or equal to 2 and n is less than or equal to 10.

In some embodiments, the one or more hydrocarbon molecules are mixed with the species in the first chamber. In some embodiments, the one or more hydrocarbon molecules are mixed with the species in the first chamber.

In some embodiments, the method includes generating a plasma in the first chamber after performing the surface treatment process and removing the workpiece from the second chamber. In some embodiments, generating the plasma in the first chamber after performing the surface treatment process includes generating one or more oxygen radicals. In some embodiments, the method includes performing a dry strip process using one or more radicals generated from a plasma in the first chamber.

In some embodiments, the one or more species are generated in a plasma from a process gas in the first chamber using an inductively coupled plasma source. In some embodiments, the process gas is an inert gas, such as helium. In some embodiments, the process gas includes a hydrogen gas and the species includes hydrogen radicals.

In some embodiments, the species include one or more hydrogen radicals generated using a heated filament. In some embodiments, the one or more organic radicals are generated using pyrolysis of molecules or UV-assisted molecule dissociation.

In some embodiments, the method includes filtering one or more ions generated by the plasma to create a filtered mixture using a separation grid separating the first chamber from the second chamber.

Another example embodiment of the present disclosure is directed to a method for processing a workpiece. The workpiece includes a silicon and carbon containing film material. The method comprising treating the workpiece with an organic radical based surface treatment process. The surface treatment process includes generating one or more species from a process gas using a plasma generated in a plasma chamber of a plasma processing apparatus; mixing one or more hydrocarbon molecules with the species to create a mixture; and exposing the workpiece to the mixture in a processing chamber, the processing chamber being separated from the plasma chamber.

In some embodiments, the process gas is an inert gas, such as helium. In some embodiments, the process gas comprises hydrogen.

In some embodiments, the method includes treating the workpiece with a second surface treatment process with organic radicals. The second surface treatment process can include: generating one or more species from a process gas using a plasma generated in a plasma chamber of a plasma processing apparatus; mixing one or more hydrocarbon molecules with the species to create a mixture; and exposing the workpiece to the mixture in a processing chamber, the processing chamber being separated from the plasma chamber.

In some embodiments, the one or more hydrocarbon molecules of the second surface treatment process are different from the one or more hydrocarbon molecules of the surface treatment process. In some embodiments, the plasma of the second surface treatment process is generated using different power supplied to an inductively coupled plasma source relative to the surface treatment process. In some embodiments, the second surface treatment process is performed at a different pressure or at a different temperature relative to the surface treatment process.

Figure 3:
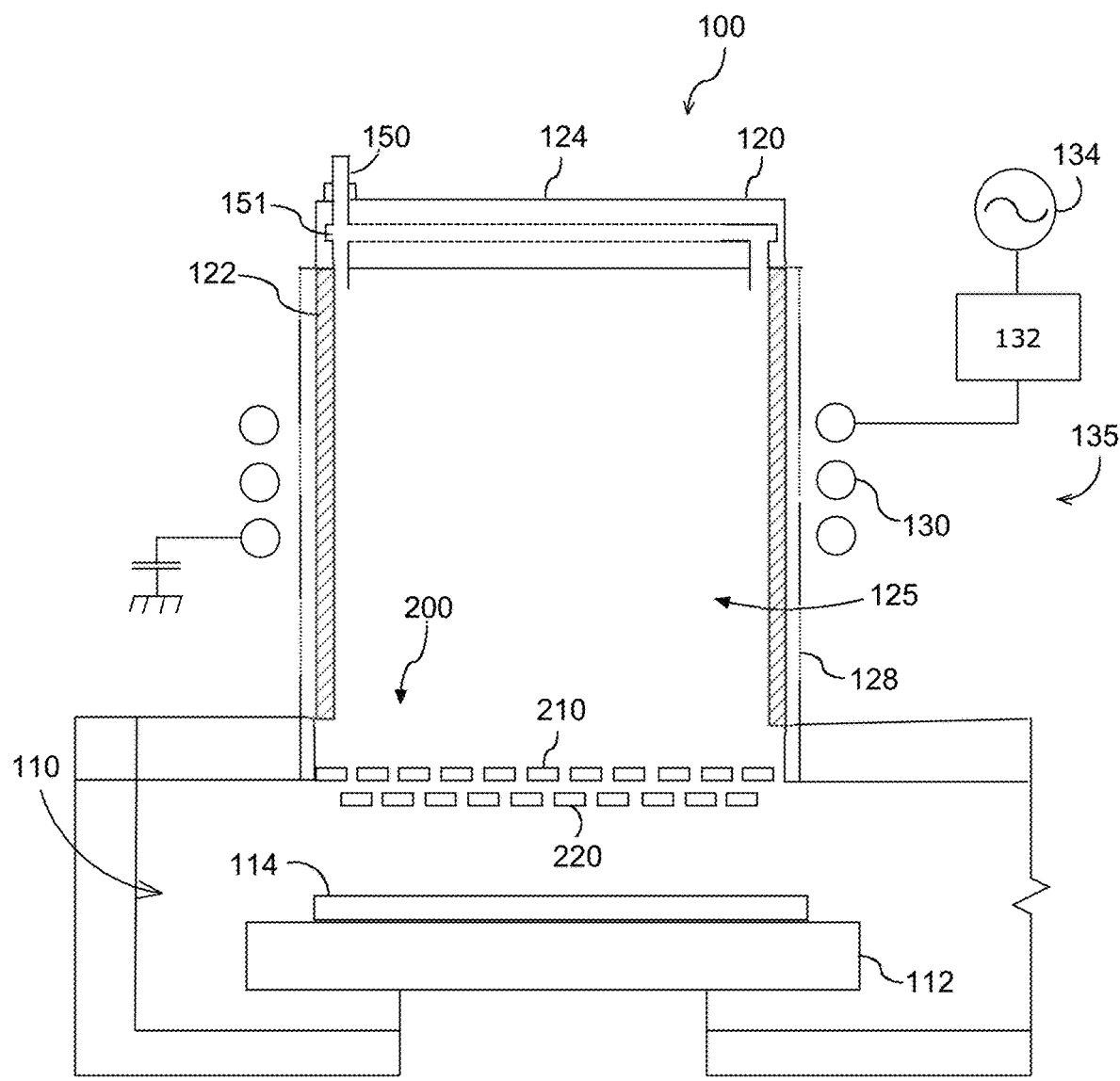
FIG. 3 depicts an example plasma processing apparatus according to example embodiments of the present disclosure.

FIG. 3 depicts an example plasma processing apparatus 100 that can be used to perform surface treatment processes according to example embodiments of the present disclosure. As illustrated, the plasma processing apparatus 100 includes a processing chamber 110 and a plasma chamber 120 that is separated from the processing chamber 110. The processing chamber 110 includes a substrate holder or pedestal 112 operable to hold a workpiece 114 to be processed, such as a semiconductor wafer. In this example illustration, a plasma is generated in the plasma chamber 120 (i.e., plasma generation region) by an inductively coupled plasma source 135 and desired species are channeled from the plasma chamber 120 to the surface of the workpiece 114 through a separation grid assembly 200.

The plasma chamber 120 includes a dielectric side wall 122 and a ceiling 124. The dielectric side wall 122, ceiling 124, and the separation grid assembly 200 define a plasma chamber interior 125. Dielectric side wall 122 can be formed from a dielectric material, such as quartz and/or alumina. The inductively coupled plasma source 135 can include an induction coil 130 disposed adjacent the dielectric side wall 122 about the plasma chamber 120. The induction coil 130 is coupled to an RF power generator 134 through a suitable matching network 132. Reactant and/or carrier gases can be provided to the chamber interior from a gas supply 150 and an annular gas distribution channel 151 or other suitable gas introduction mechanism. When the induction coil 130 is energized with RF power from the RF power generator 134, a plasma can be generated in the plasma chamber 120. In a particular embodiment, the plasma processing apparatus 100 can include an optional Faraday shield 128 to reduce capacitive coupling of the induction coil 130 to the plasma.

As shown in FIG. 3, the separation grid assembly 200 separates the plasma chamber 120 from the processing chamber 110. The separation grid assembly 200 can be used to perform ion filtering from a mixture generated by plasma in the plasma chamber 120 to generate a filtered mixture. The filtered mixture can be exposed to the workpiece 114 in the processing chamber 110.

The separation grid assembly 200 can be a multi-plate separation grid. For instance, the separation grid assembly 200 can include a first grid plate 210 and a second grid plate 220 that are spaced apart in parallel relationship to one another. The first grid plate 210 and the second grid plate can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in separation grid 200. Neutral species can flow relatively freely through the holes in the first grid plate 210 and the second grid plate 220. The size of the holes and thickness of each grid plate 210 and 220 can affect transparency for both charged and neutral species.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded.

Figure 4:
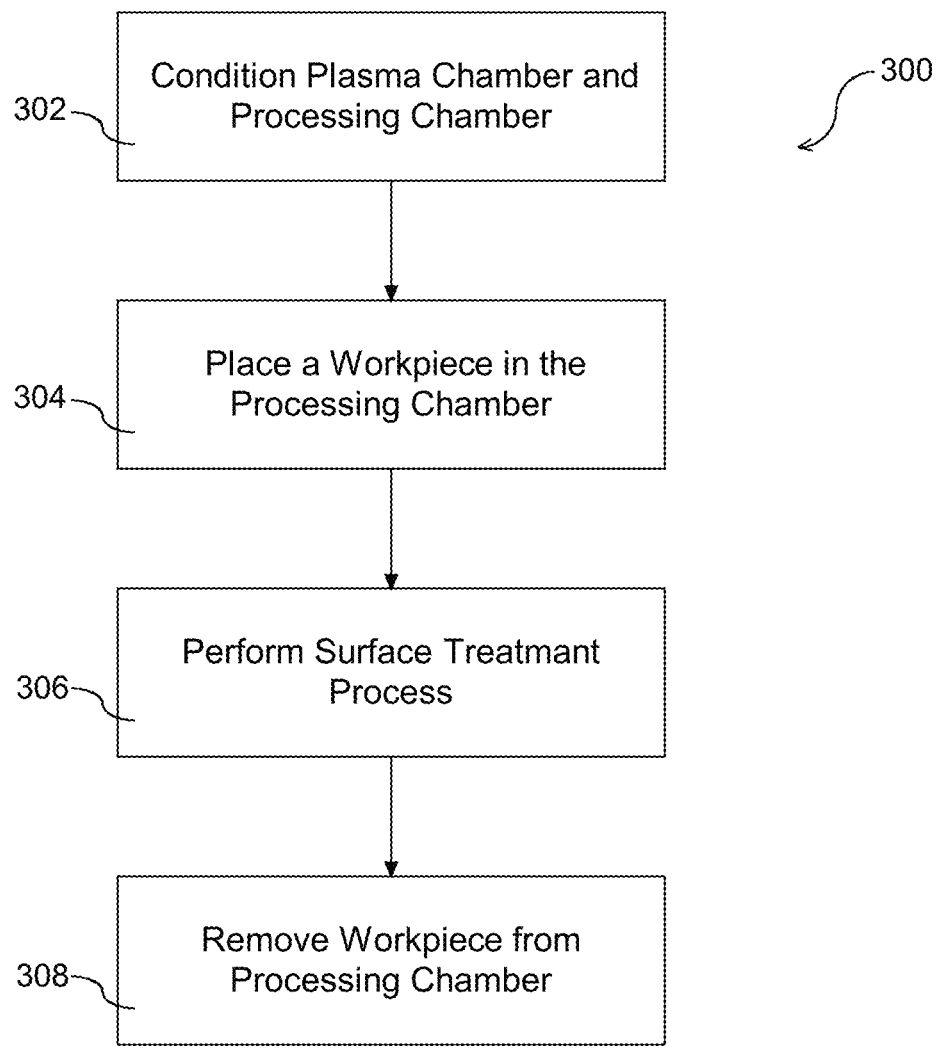
FIG. 4 depicts a flow diagram of an example method according to example embodiments of the present disclosure.

FIG. 4 depicts a flow diagram of an example method (300) for semiconductor device fabrication according to example embodiments of the present disclosure. The method (300) will be discussed with reference to the plasma processing apparatus 100 of FIG. 3 by way of example. The method (300) can be implemented in any plasma processing apparatus having a plasma chamber that is separated from a processing chamber. FIG. 4 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various steps (not illustrated) can be performed without deviating from the scope of the present disclosure.

At (302), the method can include conditioning a plasma processing apparatus for conducting a surface treatment process according to example embodiments of the present disclosure. For instance, the method can include conditioning the plasma chamber 120 and/or the processing chamber 110 for conducting a surface treatment process. In some embodiments, conditioning the plasma processing apparatus 100 can include generating an oxygen-based plasma in the plasma chamber 120 before introduction of a workpiece into the processing chamber 110. Other oxidation-based chemistry processes can be performed to condition the plasma processing apparatus without deviating from the scope of the present disclosure.

At (304), the method can include placing a workpiece in a processing chamber of the plasma processing apparatus. The processing chamber can be separated from a plasma chamber (e.g., separated by a separation grid assembly). For instance, the method can include placing the workpiece 114 onto the pedestal 112 in the processing chamber 110.

The workpiece can include a low-k dielectric material, such as silicon and carbon containing film material. In some embodiments, the silicon and carbon containing film material can include oxygen. In some embodiments, the silicon and carbon containing film material can include nitrogen. In some embodiments, the silicon and carbon containing film material can have a porosity in the range of about 1% to about 50%.

In one example, the film material can be a part of spacer structure in an FEOL application. For instance, the film material can be the film 57 illustrated in FIG. 1. In another example, the film material can be a part of an interconnect structure in a BEOL application. For instance, the film material can be the layer 64 illustrated in FIG. 2.

Referring to FIG. 4, the method can include performing a surface treatment process (306) according to example aspects of the present disclosure. The surface treatment process can be performed on the workpiece to restore damaged low-k dielectric materials (e.g., low-k dielectric materials damaged by previous etch processes). The surface treatment process can accomplish pore sealing for porous low-k dielectric materials. Example surface treatment processes will be discussed in more detail with reference to FIGS. 5 and 6. The surface treatment process can be an organic radical based surface treatment process. The organic radical based surface treatment process can be a methyl radical ($CH_3$) based process resulting in methylation of at least a portion of a surface of the low-k dielectric material.

At (308) of FIG. 4, the method can include removing the workpiece from the processing chamber. For instance, the workpiece 114 can be removed from the pedestal 112 in the processing chamber 110. The plasma processing apparatus can then be conditioned for future processing of additional workpieces.

Figure 5:
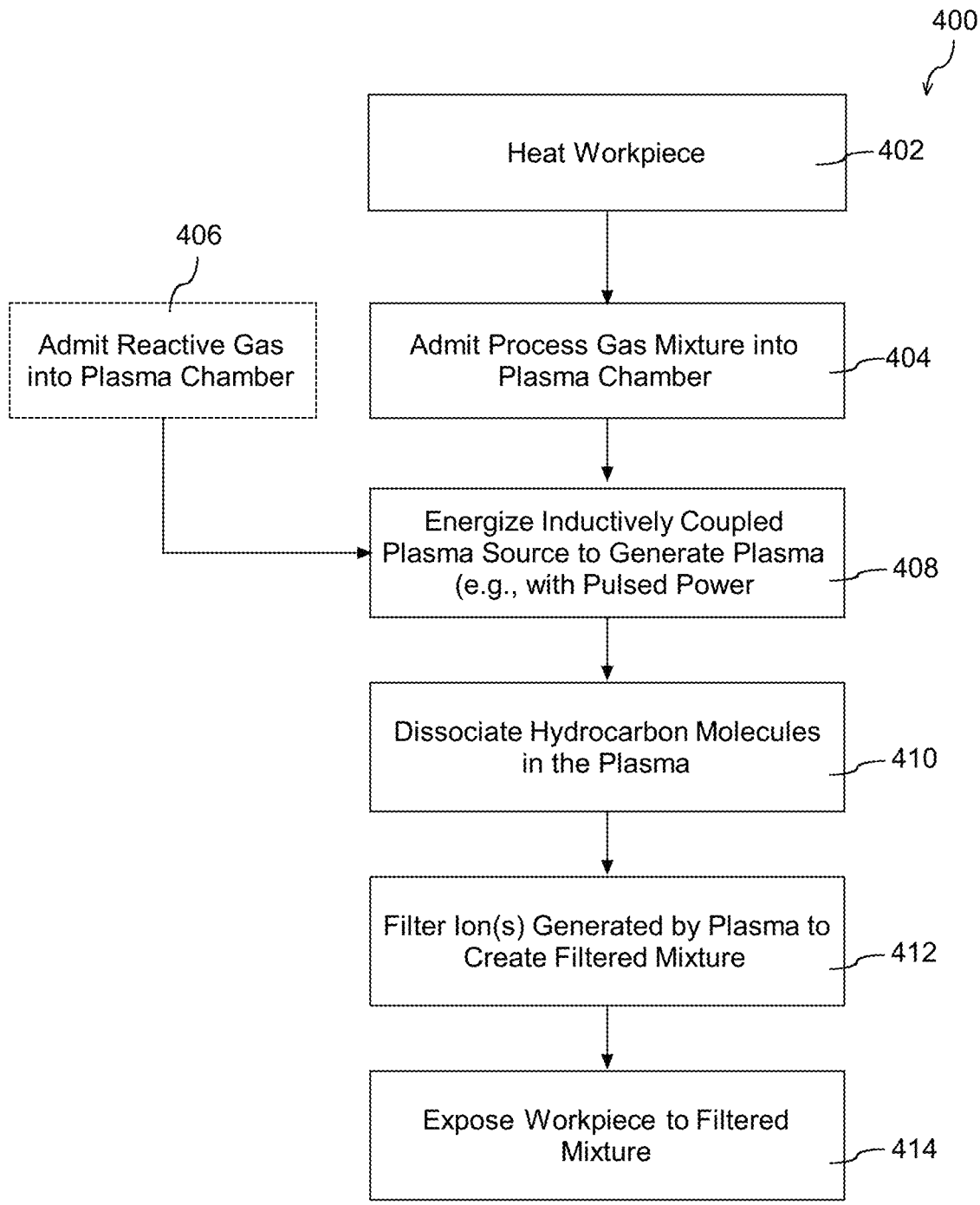
FIG. 5 depicts a flow diagram of an example surface treatment process according to example embodiments of the present disclosure.

FIG. 5 depicts a flow diagram of an example surface treatment process (400) according to example embodiments of the present disclosure. The process (400) will be discussed with reference to the plasma processing apparatus 100 of FIG. 3 by way of example. The process (400) can be implemented in any plasma processing apparatus having a plasma chamber that is separated from a processing chamber. FIG. 5 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various steps (not illustrated) can be performed without deviating from the scope of the present disclosure.

At (402), the surface treatment process can include heating a workpiece. For instance, the workpiece 114 can be heated in the processing chamber 110 to a process temperature. The workpiece 114 can be heated, for instance, using one or more heating systems associated with the pedestal 112. In some embodiments, the workpiece can be heated to a process temperature in the range of about 20° C. to about 400° C.

At (404), the surface treatment process can include admitting a process gas into a plasma chamber. For instance, a process gas can be admitted into the plasma chamber interior 125 from the gas source 150 via the annular gas distribution channel 151 or other suitable gas introduction mechanism.

In some embodiments, the process gas can include one or more hydrocarbon molecules. Example hydrocarbon molecules can include, for instance, non-cyclic alkanes $C_nH_{2n+2}$ where n is greater than or equal to one and less than or equal to 10. For instance, the hydrocarbon molecules can include methane $CH_4$, ethane $C_2H_6$, propane or iso-propane $C_3H_8$, etc.

In some embodiments, the hydrocarbon molecules can include cyclic alkanes where n is greater than or equal to five and less than or equal to ten. For instance, the hydrocarbon precursor can include cyclic alkanes such as cyclopentane $C_5H_{10}$, cyclohexane $C_6H_{12}$, methyl-cyclohexane, $C_7H_{14}$, dimethyl-cyclohexane $C_8H_{16}$, 1,3,5-trimethyl-cyclohexane $C_9H_{18}$, etc. In some embodiments, the hydrocarbon precursors can include alkenes $C_nH_{2n}$, where n is greater than or equal to two and less than or equal to ten, such as ethylene $C_2H_4$, propene $C_3H_6$, etc.

At (406), the surface treatment process can include (e.g., optionally include) admitting a second gas into the plasma chamber, such as a reactive gas, such as hydrogen gas ($H_2$). For instance, the second gas can be admitted into the plasma chamber as part of a process gas. The process gas can include a mixture including $H_2$ and nitrogen ($N_2$) and/or a mixture including $H_2$ and helium (He) and/or a mixture including $H_2$ and argon (Ar). In some embodiments, the process gas is an inert gas, such as helium, argon, or xenon. Radicals generated from the mixture of the process gas and the second gas in the plasma can assist with replacement of Si—OH bonds in damaged low-k dielectric materials Si—C (e.g. Si—$CH_3$) bonds for k-value restoration.

At (408), the surface treatment process can include energizing an inductively coupled plasma source to generate a plasma in the plasma chamber. For instance, the induction coil 130 can be energized with RF energy from the RF power generator 134 to generate a plasma in the plasma chamber interior 125. In some embodiments, the inductively coupled power source can be energized with pulsed power to obtain desired radicals with reduced plasma energy.

At (410), the surface treatment process can include dissociating one or more hydrocarbon molecules in the mixture in the plasma chamber interior using the plasma. For instance, a plasma induced in the plasma chamber interior 125 using the inductively coupled plasma source 135 can dissociate hydrocarbon molecules and other molecules in the process gas to generate radicals and ions. For instance, the one or more hydrocarbon molecules can be dissociated in the plasma to generate $CH_3$ radicals.

At (412), the surface treatment process can include filtering one or more ions generated by the plasma in the mixture to create a filtered mixture. The filtered mixture can include radicals generated by dissociation of the hydrocarbon molecules, such as $CH_3$ radicals.

In some embodiments, the one or more ions can be filtered using a separation grid assembly separating the plasma chamber from a processing chamber where the workpiece is located. For instance, the separation grid assembly 200 can be used to filter ions generated by the plasma.

The separation grid assembly 200 can have a plurality of holes. Charged particles (e.g., ions) can recombine on the walls in their path through the plurality of holes. Neutral particles (e.g., radicals such as $CH_3$ radicals) can pass through the holes.

In some embodiments, the separation grid assembly 200 can be configured to filter ions with an efficiency greater than or equal to about 90%, such as greater than or equal to about 95%. A percentage efficiency for ion filtering refers to the amount of ions removed from the mixture relative to the total number of ions in the mixture. For instance, an efficiency of about 90% indicates that about 90% of the ions are removed during filtering. An efficiency of about 95% indicates that about 95% of the ions are removed during filtering.

In some embodiments, the separation grid assembly can be a multi-plate separation grid. The multi-plate separation grid can have multiple separation grid plates in parallel. The arrangement and alignment of holes in the grid plate can be selected to provide a desired efficiency for ion filtering, such as greater than or equal to about 95%.

For instance, the separation grid assembly 200 can have a first grid plate 210 and a second grid plate 220 in parallel relationship with one another. The first grid plate 210 can have a first grid pattern having a plurality of holes. The second grid plate 220 can have a second grid pattern having a plurality of holes. The first grid pattern can be the same as or different from the second grid pattern.

At (414) of FIG. 5, the surface treatment process can include exposing the workpiece to the filtered mixture. More particularly, the workpiece can be exposed to radicals (e.g., $CH_3$ radicals) generated in the plasma and passing through the separation grid assembly. As an example, radicals (e.g., $CH_3$ radicals) can pass through the separation grid assembly 200 and be exposed on the workpiece 114. In some embodiments, exposing the workpiece to organic radicals can result in attachment of organic radicals on at least a portion of the low-k dielectric material.

As discussed above, the radicals (e.g., $CH_3$ radicals) can provide for k-value restoration of low-k materials. For instance, the radicals can be used to replace Si—OH bonds in a damaged low-k dielectric material with Si—$CH_3$ bonds, leading to k-value restoration. In addition, the radicals can provide for pore sealing of a porous low-k material. Moreover, the $CH_3$ radicals do not negatively affect other materials (e.g., exposed underlying Cu layer 67 in BEOL interconnect structure 60).

Figure 6:
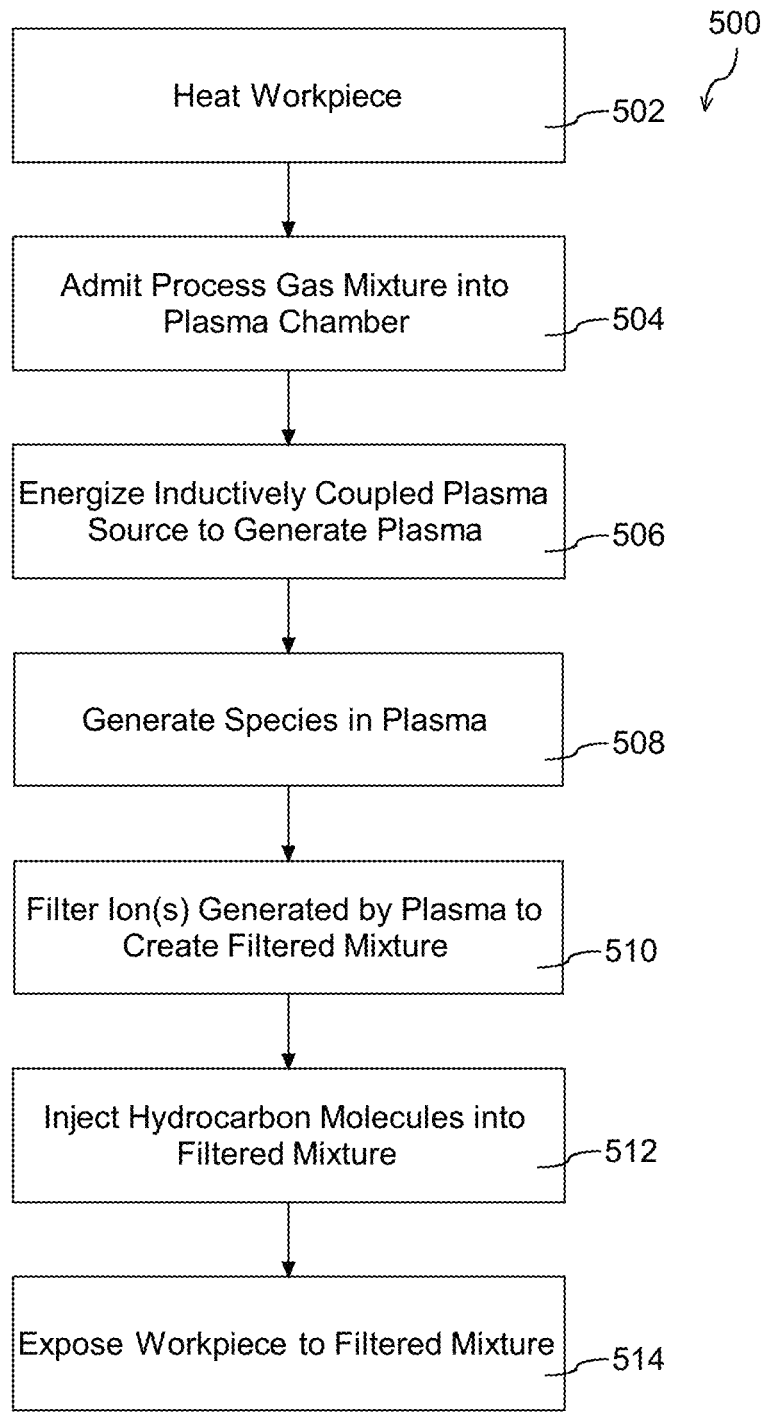
FIG. 6 depicts flow diagram of an example surface treatment process according to example embodiments of the present disclosure.

FIG. 6 depicts a flow diagram of an example surface treatment process (500) according to example embodiments of the present disclosure. The process (500) will be discussed with reference to the plasma processing apparatus 100 of FIG. 3 by way of example. The process (500) can be implemented in any plasma processing apparatus having a plasma chamber that is remote from a processing chamber. FIG. 6 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various steps (not illustrated) can be performed without deviating from the scope of the present disclosure.

At (502), the surface treatment process can include heating a workpiece. For instance, the workpiece 114 can be heated in the processing chamber to a process temperature. The workpiece 114 can be heated, for instance, using one or more heating systems associated with the pedestal 112. In some embodiments, the workpiece can be heated to a temperature in the range of about 50° C. to about 400° C.

At (504), the surface treatment process can include admitting a process gas mixture into the plasma chamber. For instance, a process gas can be admitted into the plasma chamber interior 125 from the gas source 150 via the annular gas distribution channel 151 or other suitable gas introduction mechanism. The process gas can include a reactive gas, such as hydrogen gas ($H_2$). The process gas can include a carrier gas such as $N_2$, Ar and/or He. For example, in some embodiments, the process gas can be a mixture including $H_2$ and $N_2$. In some other embodiments, the process gas can be a mixture including $H_2$ and He. In yet some other embodiments, the process gas can be a mixture including $H_2$ and Ar.

In some embodiments, the process gas can be an inert gas. For instance, the process gas can be an inert gas with no reactive gas. In particular embodiments, the process gas can be helium, argon, xenon or other inert gas.

At (506), the surface treatment process can include energizing an inductively coupled plasma source to generate a plasma in the plasma chamber. For instance, the induction coil 130 can be energized with RF energy from the RF power generator 134 to generate a plasma in the plasma chamber interior 125. In some embodiments, the inductively coupled power source can be energized with pulsed power to obtain desired species with reduced plasma energy.

At (508), the surface treatment process can include generating one or more species in the plasma from the process gas. For instance, a plasma induced in the plasma chamber interior 125 from a reactive process gas (e.g., $H_2$) using the inductively coupled plasma source 135 can dissociate molecules in the process gas mixture to generate radicals (e.g. H radicals) and ions. As another example, a plasma induced in the plasma chamber interior 125 from an inert process gas (e.g., He) using the inductively coupled plasma source 135 can generate one or more excited inert gas molecules (e.g., excited He molecules).

At (510), the surface treatment process can include filtering one or more ions generated by the plasma in the mixture to create a filtered mixture. The filtered mixture can include species generated in the plasma from the process gas.

In some embodiments, the one or more ions can be filtered using a separation grid assembly separating the plasma chamber from a processing chamber where the workpiece is located. For instance, the separation grid assembly 200 can be used to filter ions generated by the plasma.

The separation grid assembly 200 can have a plurality of holes. Charged particles (e.g., ions) can recombine on the walls in their path through the plurality of holes. Neutrals (e.g., radicals) can pass through the holes. In some embodiments, the separation grid assembly 200 can be configured to filter ions with an efficiency greater than or equal to about 90%, such as greater than or equal to about 95%.

In some embodiments, the separation grid assembly can be a multi-plate separation grid. The multi-plate separation grid can have multiple separation grid plates in parallel. The arrangement and alignment of holes in the grid plate can be selected to provide a desired efficiency for ion filtering, such as greater than or equal to about 95%.

At (512), the method can include injecting hydrocarbon molecules into the filtered mixture post filtering. The hydrocarbon molecules can react with the filtered mixture to generate desired organic radicals (e.g., $CH_3$ radicals).

Example hydrocarbon molecules can include, for instance, non-cyclic alkanes $C_nH_{2n+2}$ where n is greater than or equal to one and less than or equal to 10. For instance, the hydrocarbon molecules can include methane $CH_4$, ethane $C_2H_6$, propane or iso-propane $C_3H_8$, etc.

In some embodiments, the hydrocarbon molecules can include cyclic alkanes $C_nH_{2n}$, where n is greater than or equal to five and less than or equal to ten. For instance, the hydrocarbon precursor can include cyclic alkanes such as cyclopentane $C_5H_{10}$, cyclohexane $C_6H_{12}$, methyl-cyclohexane, $C_7H_{14}$, dimethyl-cyclohexane $C_8H_{16}$, 1,3,5-trimethyl-cyclohexane $C_9H_{18}$, etc. In some embodiments, the hydrocarbon precursors can include alkenes $C_nH_{2n}$, where n is greater than or equal to two and less than or equal to ten, such as ethylene $C_2H_4$, propene $C_3H_6$, etc.

Figure 7:
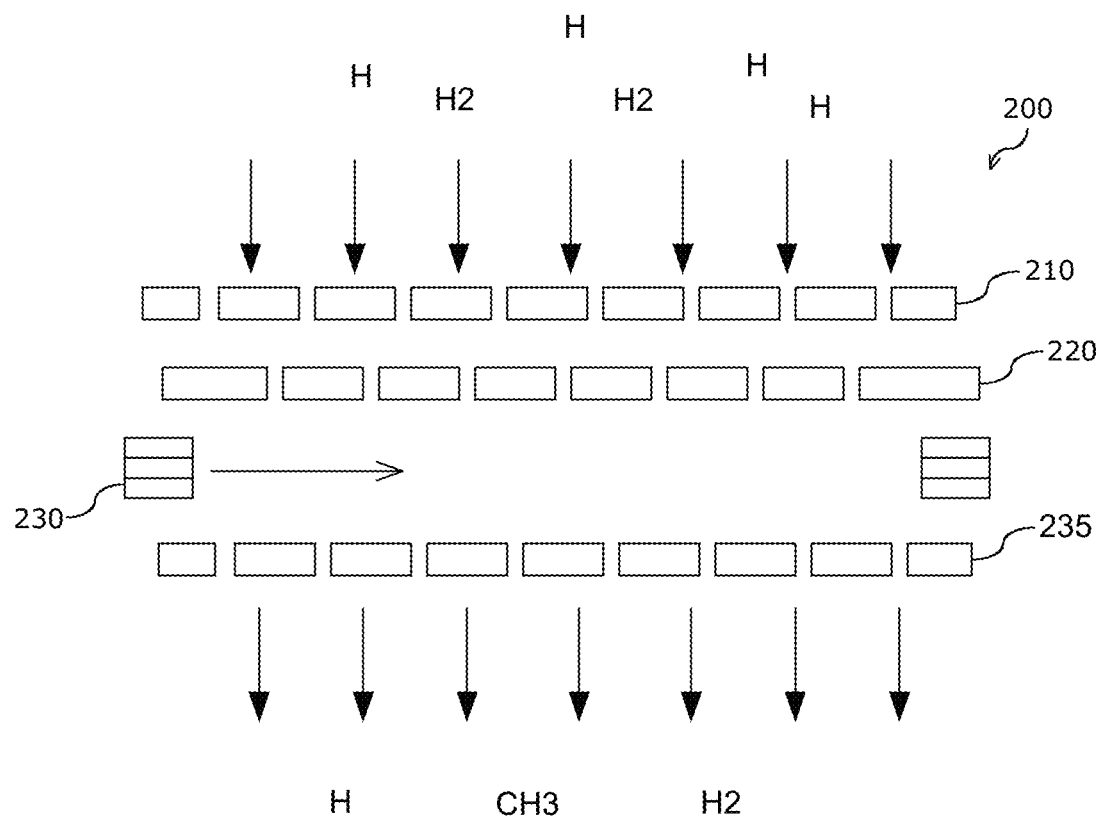
FIG. 7 depicts example gas injection after ion filtering during a surface treatment process according to example embodiments of the present disclosure.

FIG. 7 depicts an example separation grid assembly 200 for injection of hydrocarbon molecules post ion filtering according to example embodiments of the present disclosure. More particularly, the separation grid assembly 200 includes a first grid plate 210 and a second grid plate disposed in parallel relationship for ion/UV filtering.

The first grid plate 210 and a second grid plate 220 can be in parallel relationship with one another. The first grid plate 210 can have a first grid pattern having a plurality of holes. The second grid plate 220 can have a second grid pattern having a plurality of holes. The first grid pattern can be the same as or different from the second grid pattern. Charged particles (e.g., ions) can recombine on the walls in their path through the holes of each grid plate 210, 220 in the separation grid 200. Neutral species (e.g., radicals) can flow relatively freely through the holes in the first grid plate 210 and the second grid plate 220.

Subsequent to the second grid plate 220, a gas injection source 230 can be configured to admit hydrocarbon gas into the filtered mixture. Radicals (e.g., $CH_3$ radicals) resulting from the injection of hydrocarbon gas can pass through a third grid plate 235 for exposure to the workpiece.

At (514) of FIG. 6, the surface treatment process can include exposing the workpiece to the filtered mixture. More particularly, the workpiece can be exposed to radicals (e.g., $CH_3$ radicals) after injection of the hydrocarbon molecules. As an example, radicals (e.g., $CH_3$ radicals) can pass through the third grid plate 235 (FIG. 7) and can be exposed on the workpiece 114. In some embodiments, exposing the workpiece to organic radicals can result in methylation of at least a portion of the low-k dielectric material.

Figure 8:
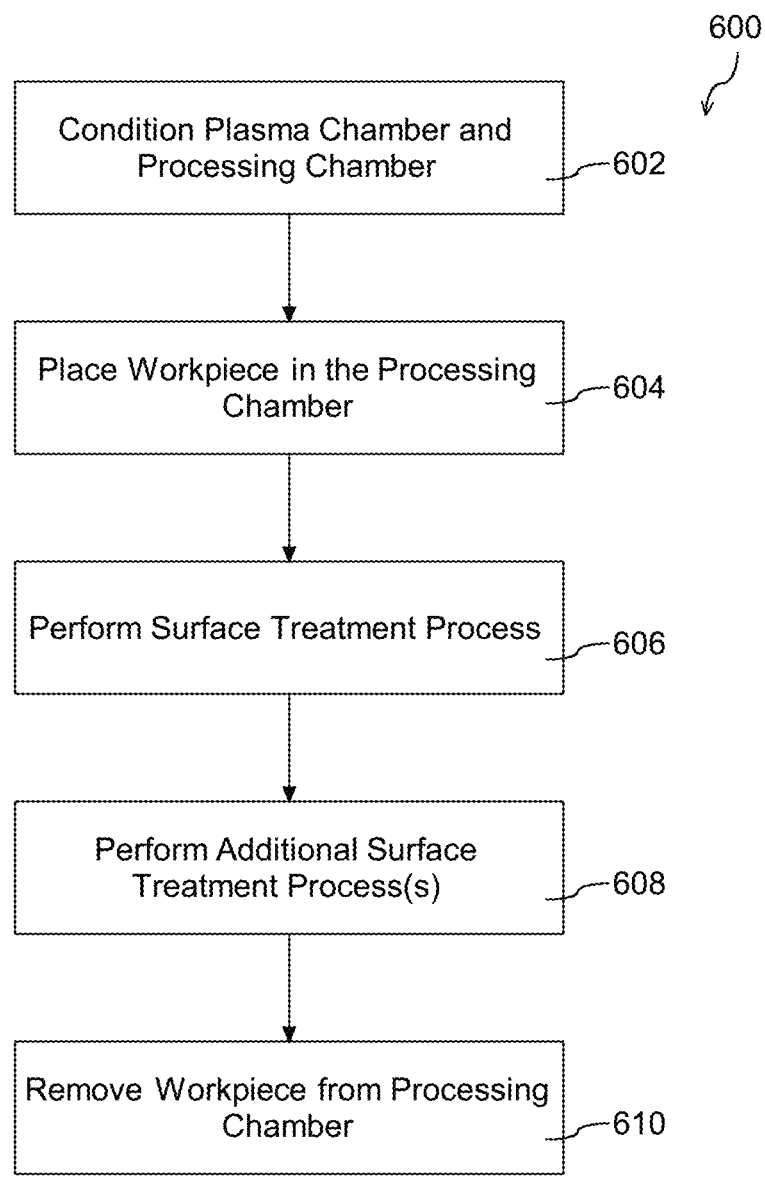
FIG. 8 depicts a flow diagram of an example method according to example embodiments of the present disclosure.

FIG. 8 depicts a flow diagram of an example method (600) for semiconductor device fabrication according to example embodiments of the present disclosure. The method (600) will be discussed with reference to the plasma processing apparatus 100 of FIG. 3 by way of example. The method (600) can be implemented in any plasma processing apparatus having a plasma chamber that is remote from a processing chamber. FIG. 8 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various steps (not illustrated) can be performed without deviating from the scope of the present disclosure.

At (602), the method can include conditioning a plasma processing apparatus for conducting a surface treatment process according to example embodiments of the present disclosure. For instance, the method can include conditioning the plasma chamber 120 and/or the processing chamber 110 for conducting a surface treatment process. In some embodiments, conditioning the plasma processing apparatus 100 can include generating an oxygen-based plasma in the plasma chamber 120 before introduction of a workpiece into the processing chamber 110. Other oxidation-based chemistry processes can be performed to condition the plasma processing apparatus without deviating from the scope of the present disclosure.

At (604), the method can include placing a workpiece in a processing chamber of a plasma processing apparatus. The processing chamber can be separated from a plasma chamber (e.g., separated by a separation grid assembly). For instance, the method can include placing the workpiece 114 onto the pedestal 112 in the processing chamber 110.

The workpiece can include a low-k dielectric material, such as silicon and carbon containing film material. In some embodiments, the silicon and carbon containing film material can include oxygen. In some embodiments, the silicon and carbon containing film material can include nitrogen. In some embodiments, the silicon and carbon containing film material can have a porosity in the range of about 1% to about 50%.

In one example, the film material can be a part of spacer structure in an FEOL application. For instance, the film material can be the film 57 illustrated in FIG. 1. In another example, the film material can be a part of an interconnect structure in a BEOL application. For instance, the film material can be the layer 64 illustrated in FIG. 2.

Referring to FIG. 8, the method can include performing a surface treatment process (606) according to example aspects of the present disclosure. The surface treatment process can be performed on the workpiece to restore damaged low-k dielectric materials (e.g., low-k dielectric materials damaged by previous etch processes). The surface treatment process can accomplish pore sealing for porous low-k dielectric materials. Example surface treatment processes are discussed in more detail with reference to FIGS. 5 and 6.

At (608) of FIG. 8, the method can include performing one or more additional surface treatment processes according to example aspects of the present disclosure. The one or more additional surface treatment process can be performed on the workpiece to restore damaged low-k dielectric materials (e.g., low-k dielectric materials damaged by previous etch processes). The one or more additional surface treatment process can accomplish pore sealing for porous low-k dielectric materials. Example surface treatment processes will be discussed in more detail with reference to FIGS. 5 and 6.

In some embodiments, the one or more additional surface treatment processes can have different process characteristics relative to previously performed surface treatment processes. For instance, smaller size hydrocarbon molecules can be used in a first surface treatment process for effective diffusion into a damaged low-k material for k-value restoration. Larger and/or cyclic hydrocarbon molecules can be used in a second surface treatment process for effective pore sealing of a porous low-k material. As another example, different amounts of power to energize an inductively coupled plasma source for generation of the plasma in a remote plasma chamber can be used for each of the plurality of surface treatment processes. As another example, different pressures can be used for each of the plurality of surface treatment processes.

At (610) of FIG. 8, the method can include removing the workpiece from the processing chamber. For instance, the workpiece 114 can be removed from the pedestal 112 in the processing chamber 110. The plasma processing apparatus can then be conditioned for future processing of additional workpieces.

Figure 9:
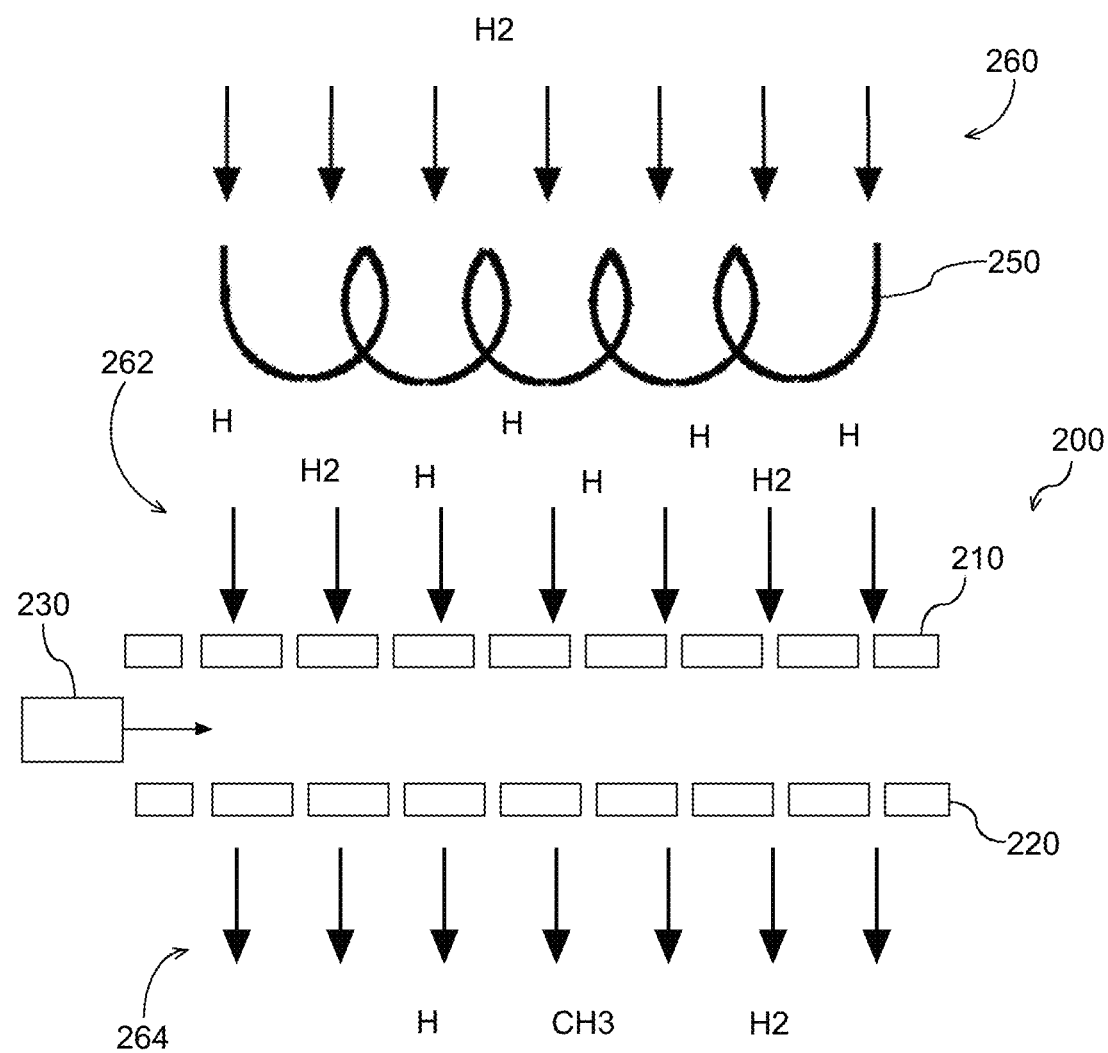
FIG. 9 depicts example generation of organic radicals according to example embodiments of the present disclosure.

In some embodiments, the organic radicals can be generated using a different source of hydrogen radicals. For instance, as shown in FIG. 9, a hydrogen gas $H_2$ can be passed over a heated filament (e.g., a tungsten filament) to generate hydrogen radicals in a first chamber. The hydrogen radicals can be passed through a separation grid 200.

The separation grid 200 includes a first grid plate 210 and a second grid plate 220 disposed in parallel relationship. The first grid plate 210 can have a first grid pattern having a plurality of holes. The second grid plate 220 can have a second grid pattern having a plurality of holes. The first grid pattern can be the same as or different from the second grid pattern. Charged particles (e.g., ions) can recombine on the walls in their path through the holes of each grid plate 210, 220 in the separation grid 200. Neutral species (e.g., H radicals) can flow relatively freely through the holes in the first grid plate 210 and the second grid plate 220.

Subsequent to the first grid plate 210, a gas injection source 230 can be configured to admit hydrocarbon gas into the filtered mixture. Radicals (e.g., $CH_3$ radicals) 264 resulting from the injection of hydrocarbon gas can pass through the second grid plate 220 for exposure to the workpiece.

The hydrocarbon gas can include one or more hydrocarbon molecules. Example hydrocarbon molecules can include, for instance, non-cyclic alkanes $C_nH_{2n+2}$ where n is greater than or equal to one and less than or equal to 10. For instance, the hydrocarbon molecules can include non-cyclic alkanes, such as methane $CH_4$, ethane $C_2H_6$, propane or iso-propane $C_3H_8$, etc. The hydrocarbon molecule(s) can include cyclic alkanes $C_nH_{2n}$, where n is greater than or equal to five and less than or equal to ten. For instance, the hydrocarbon molecule(s) can include cyclic alkanes such as cyclopentane $C_5H_{10}$, cyclohexane $C_6H_{12}$, methyl-cyclohexane, $C_7H_{14}$, dimethyl-cyclohexane $C_8H_{16}$, 1,3,5-trimethyl-cyclohexane $C_9H_{18}$, etc. In some embodiments, the hydrocarbon molecule(s) can include alkenes $C_nH_{2n}$, where n is greater than or equal to one and less than or equal to ten, such as ethylene $C_2H_4$, propene $C_3H_6$, etc.

The present example is discussed with reference to a separation grid with two grid plates for example purposes. Those of ordinary skill in the art, using the disclosures provided herein, will understand that more or fewer grid plates can be used without deviating from the scope of the present disclosure.

The organic radicals (e.g., $CH_3$ radicals) can be generated using other approaches with deviating from the scope of the present disclosure. As one example, organic radicals (e.g., $CH_3$ radicals) can be generated using pyrolysis (thermal decomposition) of molecules (e.g., azomethane $CH_3$—N=N—$CH_3$). As another example, organic radicals can be generated or UV-assisted molecule dissociation (e.g., acetone $CH_3COCH_3$).

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method for processing a workpiece, the workpiece comprising a silicon and carbon containing film material, the method comprising performing a post etch organic radical based surface treatment process on the silicon and carbon containing film material after an etch process has been performed on the silicon and carbon containing material, the organic radical based surface treatment process comprising:
   generating one or more species using a plasma in a first chamber;
   mixing one or more hydrocarbon molecules with the species generated by the plasma to create a mixture comprising one or more organic radicals in a gas phase, wherein the one or more hydrocarbon molecules have a chemical formula of $C_nH_{2n+2}$ where n is greater than or equal to one and less than or equal to ten or wherein the one or more hydrocarbon molecules have a chemical formula of $C_nH_{2n}$ where n is greater than or equal to two and less than or equal to ten; and
   exposing the silicon and carbon containing layer on the workpiece to the mixture in a second chamber.

2. The method of claim 1, wherein the organic radical based surface treatment process results in methylation on at least a portion of the silicon and carbon containing film material.

3. The method of claim 1, wherein the silicon and carbon containing film material comprises oxygen.

4. The method of claim 1, wherein the silicon and carbon containing film material has a porosity of about 1% to about 50%.

5. The method of claim 1, wherein the silicon and carbon containing film material comprises nitrogen.

6. The method of claim 1, wherein the silicon and carbon containing film material is used as at least a part of a spacer structure formed in a front-end-of-line application.

7. The method of claim 1, wherein the silicon and carbon containing film material is used as at least a part of an interconnect structure formed in a back-end-of-line application.

8. The method of claim 1, wherein the one or more hydrocarbon molecules are mixed with the species in the first chamber.

9. The method of claim 1, wherein the method comprises generating a plasma in the first chamber after performing the surface treatment process and removing the workpiece from the second chamber.

10. The method of claim 9, wherein generating the plasma in the first chamber after performing the surface treatment process comprises generating one or more oxygen radicals.

11. The method of claim 1, wherein the one or more organic radicals comprise a $CH_3$ radical.

12. The method of claim 1, wherein the method comprises performing a dry strip process using one or more radicals generated from a plasma in the first chamber.

13. The method of claim 1, wherein the one or more species are generated in a plasma from a process gas in the first chamber using an inductively coupled plasma source.

14. The method of claim 13, wherein the process gas is an inert gas.

15. The method of claim 14, wherein the inert gas is helium.

16. The method of claim 13, wherein the process gas comprises a hydrogen gas and the species comprise hydrogen radicals.

17. The method of claim 1, wherein the species comprise one or more hydrogen radicals generated using a heated filament.

18. The method of claim 1, wherein the one or more organic radicals are generated using pyrolysis of molecules or UV-assisted molecule dissociation.

19. The method of claim 13, wherein filtering one or more ions generated by the plasma to create a filtered mixture using a separation grid separating the first chamber from the second chamber.

20. A method for processing a workpiece, the workpiece comprising a silicon and carbon containing film material, the method comprising treating the workpiece with post etch organic radical based surface treatment process after an etch process has been performed on the silicon and carbon containing material, the surface treatment process comprising:
   generating one or more species from a process gas using a plasma generated in a plasma chamber of a plasma processing apparatus;
   mixing one or more hydrocarbon molecules with the species generated by the plasma to create a mixture comprising one or more organic radicals in a gas phase, wherein the one or more hydrocarbon molecules have a chemical formula of $C_nH_{2n+2}$ where n is greater than or equal to one and less than or equal to ten or wherein the one or more hydrocarbon molecules have a chemical formula of $C_nH_{2n}$ where n is greater than or equal to two and less than or equal to ten; and exposing the workpiece to the mixture in a processing chamber, the processing chamber being separated from the plasma chamber.

21. The method of claim 20, wherein the process gas is an inert gas.

22. The method of claim 20, wherein the process gas comprises hydrogen.

23. The method of claim 20, wherein the method comprises treating the workpiece with a second surface treatment process with organic radicals.

24. The method of claim 23, wherein the second surface treatment process comprises:

generating one or more species from a process gas using a plasma generated in a plasma chamber of a plasma processing apparatus;

mixing one or more hydrocarbon molecules with the species to create a mixture;

exposing the workpiece to the mixture in a processing chamber, the processing chamber being separated from the plasma chamber.

25. The method of claim 24, wherein the one or more hydrocarbon molecules of the second surface treatment process are different from the one or more hydrocarbon molecules of the surface treatment process.

26. The method of claim 24, wherein the plasma of the second surface treatment process is generated using different power supplied to an inductively coupled plasma source relative to the surface treatment process.

27. The method of claim 24, wherein the second surface treatment process is performed at a different pressure or at a different temperature relative to the surface treatment process.

* * * * *